United States Patent
Wright et al.

(10) Patent No.: US 7,340,666 B1
(45) Date of Patent: Mar. 4, 2008

(54) METHOD AND APPARATUS FOR USING MEMORY COMPRESSION TO ENHANCE ERROR CORRECTION

(75) Inventors: Gregory M. Wright, Mountain View, CA (US); Mario I. Wolczko, San Carlos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 462 days.

(21) Appl. No.: 10/944,172

(22) Filed: Sep. 16, 2004

(51) Int. Cl.
*H03M 13/00* (2006.01)
(52) U.S. Cl. ........................ 714/774; 714/779
(58) Field of Classification Search ........... 714/774, 714/779
See application file for complete search history.

(56) References Cited

U.S. PATENT DOCUMENTS 3,622,982 A * 11/1971 Clark et al. ................. 714/783
5,200,962 A * 4/1993 Kao et al. ................... 714/774
5,341,384 A * 8/1994 Miya et al. ................. 714/747
5,875,280 A * 2/1999 Takaiwa et al. ............ 386/120
6,405,338 B1 * 6/2002 Sinha et al. ................ 714/752

OTHER PUBLICATIONS

Chauchin Su and Jyrghong Wang, ECCSyn—A Synthesis Tool for ECC Circuits, IEEE 1993.*

* cited by examiner

*Primary Examiner*—Joseph D. Torres
(74) *Attorney, Agent, or Firm*—Park, Vaughan & Fleming LLP

(57) ABSTRACT

A system for improving a memory's error detecting and error correcting capabilities. During operation, the system receives a data-word. Next, the system compresses the data-word into a compressed-word. If the amount of compression is greater than or equal to a compression-threshold, the system applies a strong error-correcting-code to the compressed-word to generate a coded-word. On the other hand, if the amount of compression is less than the compression-threshold, the system applies a weak error-correcting-code to the data-word to generate a coded-word. In either case the size of the coded-word is less than or equal to the size of a storage-word. The system then generates a flag that indicates the type of error-correcting code that was used to generate the coded-word. The system then stores the flag along with the coded-word in the memory.

21 Claims, 3 Drawing Sheets

METHOD AND APPARATUS FOR USING MEMORY COMPRESSION TO ENHANCE ERROR CORRECTION

BACKGROUND

1. Field of the Invention

The present invention relates to error detection and error correction in computer memories. More specifically, the present invention relates to a method and apparatus for using data compression to improve the error detecting and error correcting capabilities of a memory that supports error detection and error correction.

2. Related Art

As computer system memories continue to grow in size, it is becoming increasingly common for transient errors to arise within the large volumes of data that are stored in these memories.

In order to remedy this problem, computer systems often employ error-correcting codes to correct transient errors that occur in a memory. When a data word is stored into the memory, the system automatically computes an error-correcting code for the data word that is stored along with the data word in the memory. When the data word is subsequently read from the memory, it is automatically checked for errors using the error-correcting code. If an error has occurred, the error can often be corrected through use of the error-correcting code.

Note that, the number of errors that can be corrected depends on the type of error-correcting code that is used. For example, 8 extra bits of a SECDED (single-error correction, double-error detection) code can be added to a 64-bit word to allow an arbitrary single-bit error to be corrected, or two-bit errors to be detected (but not corrected).

For further improved reliability, we would like more errors to be correctable. Unfortunately, codes capable of correcting multiple errors require much more storage overhead.

Hence, what is needed is a method and apparatus for improving the reliability of a memory that supports error detection and error correction without significantly increasing the required storage space.

SUMMARY

One embodiment of the present invention provides a system that improves the error detecting and error correcting capabilities of a memory that supports error detection and error correction for data that is stored in storage-words. During operation, the system receives a data-word. Next, the system compresses the data-word into a compressed-word. If the amount of compression is greater than or equal to a compression-threshold, the system applies a strong error-correcting-code to the compressed-word to generate a coded-word. On the other hand, if the amount of compression is less than the compression-threshold, the system applies a weak error-correcting-code to the data-word to generate a coded-word. Note that in either case the size of the coded-word is less than or equal to the size of a storage-word. The system then generates a flag that indicates the type of error-correcting code that was used to generate the coded-word. Finally, the system stores the flag along with the coded-word in the memory. In this manner, the present invention increases the reliability of the memory without requiring a significantly larger amount of memory.

In a variation on this embodiment, the system receives a coded-word along with the flag, which indicates the type of error-correcting code that was used to generate the coded-word. If the weak error-correcting-code was used, the system decodes the coded-word to extract the data-word using the weak error-correcting-code. On the other hand, if the strong error-correcting-code was used, the system decodes the coded-word to extract the compressed-word using the strong error-correcting-code. Next, the system decompresses the compressed-word to extract the data-word.

In a variation on this embodiment, the data-word is 64 bits long, and the compression-threshold is equal to 28 bits, so that the strong error-correcting-code is used only if the size of the compressed-word is less than or equal to 36 bits.

In a variation on this embodiment, the weak error-correcting-code is a SECDED (single error correction, double error detection) code.

In a further variation on this embodiment, the SECDED code is based on a Hamming (71, 64) code, which uses 71 bits to encode 64 bits of data.

In a variation on this embodiment, the strong error-correcting-code is a 3-error-correcting (23, 12) Golay code, which uses 23 bits to encode 12 bits of data.

In a variation on this embodiment, the system applies the strong error-correcting-code to the compressed-word by first splitting the compressed-word into a plurality of sub-words. Next, the system applies the strong error-correcting-code to each sub-word. The system then concatenates the coded sub-words to form the coded-word.

In a variation on this embodiment, the system generates the flag by applying a flag error-correcting-code to an indicator, which contains one or more bits that indicate the type of error-correcting code that was used to generate the coded-word.

In a further variation on this embodiment, applying the flag error-correcting-code to the indicator involves concatenating multiple copies of the indicator.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Computer Memory

Figure 1:
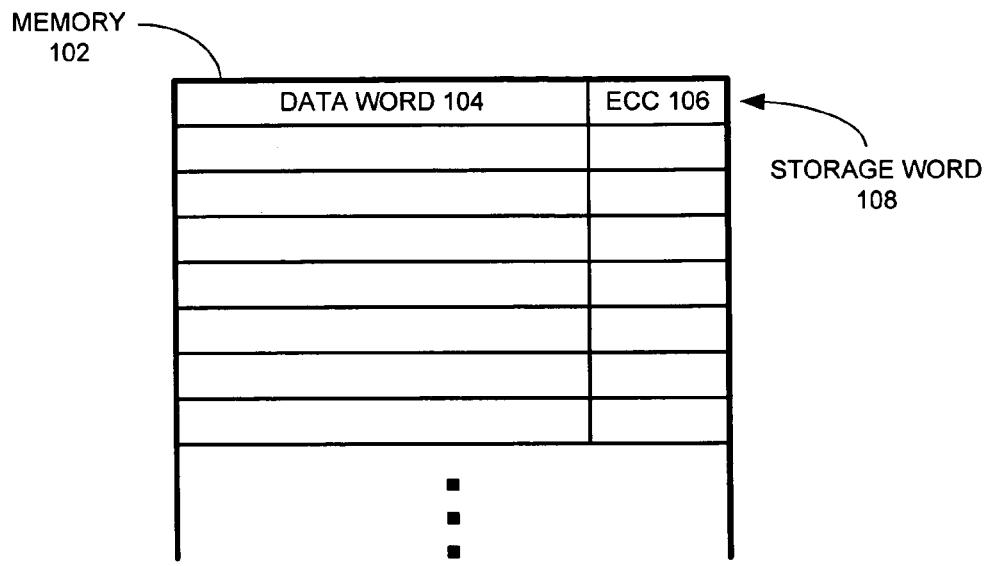
FIG. 1 illustrates a computer memory that supports error detection and error correction in accordance with an embodiment of the present invention.

FIG. 1 illustrates a computer memory that supports error detection and error correction 102 in accordance with an embodiment of the present invention. The memory 102 stores a plurality of storage words, such as storage word 108.

Information stored in a memory is susceptible to corruption by natural physical processes. For example, storage word 108 may be corrupted by an alpha-particle collision. Hence, to increase reliability, an error-correcting code is applied to a data word to generate a coded word, which is then stored in memory as a storage word, such as storage word 108.

In one embodiment of the present invention, a storage word contains a data word, such as data word 104, along with the ECC (error-correcting code) bits, such as ECC bits 106. Note that, in this embodiment, the coded word is formed by appending the ECC (error-correcting code) bits 106 to a data word 104.

Specifically, in one embodiment of the present invention, 8 extra bits of a SECDED (single-error correction, double-error detection) code can be appended to a 64-bit data word to allow an arbitrary single-bit error in a storage word to be corrected, or two-bit errors in a storage word to be detected (but not corrected).

In another embodiment of the present invention, an error-correcting code is applied to a data word to directly generate the coded word, without performing the two-step process described above, namely, the two-step process of (a) generating the ECC bits, and (b) appending the ECC bits to the data word.

Specifically, in one embodiment of the present invention, a 3-error-correcting (23, 12) Golay code can be applied to a 12-bit data word to generate a 23-bit coded word. Note that the 23-bit coded word does not contain a "data" portion and an "ECC" portion. Instead, the (23, 12) Golay code directly maps a 12-bit data word to a 23-bit coded word, which allows the detection and correction of up to 3-bit errors.

Note that the SECDED can correct only one-bit errors, whereas the (23, 12) Golay code can correct up to three-bit errors.

Unfortunately, codes capable of correcting multiple-bit errors in memory words require much more storage overhead and hence are not commonly used.

For example, note that the SECDED code only requires 8 bits of overhead for every 64 bits of data, whereas the 3-error-correcting (23, 12) Golay code requires a very large overhead: 11-bits of overhead for every 12-bits of data.

Computer Memory that Uses Data Compression to Improve Reliability

Figure 2:
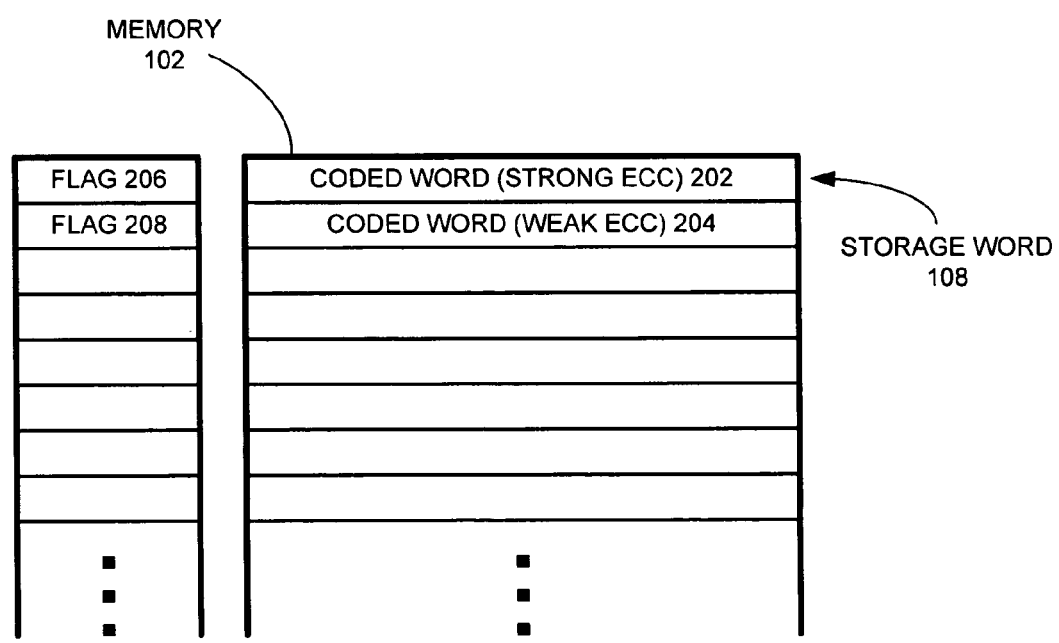
FIG. 2 illustrates a computer memory that uses data compression to improve its error detecting and error correcting capabilities in accordance with an embodiment of the present invention.

FIG. 2 illustrates a computer memory that uses data compression to improve its error detecting and error correcting capabilities in accordance with an embodiment of the present invention.

Computer memories are typically designed to store fixed-size storage words, such as storage word 108. This is because a memory that stores fixed-size storage words is less complicated (and hence, more economical) than a memory that stores variable-size storage words.

It is well known that much of the data processed by computers is highly redundant. For example, English text is highly redundant. But, since the amount of compression depends on the actual data values, the compressed data words typically have variable lengths.

As a result, storing compressed data words requires a complicated memory design that can store variable-size storage words. Moreover, note that not all data words will be compressible.

In contrast, in the present invention, the data words are compressed, but they are stored in the same space that the original (uncompressed) data words would have occupied. As a result, the present invention does not require a complicated memory design that stores variable-size storage words. Furthermore, in the present invention, the space left over after compression is used for storing the compressed data using a multiple-error-correcting code.

In other words, the present invention removes redundancy from the compressible data and then reintroduces it in a form that can be used for error detection and error correction.

Additionally, in the present invention, incompressible data are stored uncompressed and protected with only the standard ECC bits. Thus, the improvement in system reliability is probabilistic (based on the ratio of compressible to incompressible data). As a result, the present invention allows multiple error correction in the compressible case with little increase in storage space.

Specifically, in FIG. 2, the computer memory 102 contains a plurality of storage words, such as storage word 108. Note that, each storage word stores a coded word, such as coded words 202 and 204.

A coded word can be generated by using either a strong error-correcting-code, such as coded word 202, or by using a weak error-correcting-code, such as coded word 204. Note that only the compressible data is encoded using the strong error-correcting-code. Furthermore, in one embodiment of the present invention, the coded word is generated using one of several error-correcting-codes. For example, the highly-compressible data can be encoded using a strong error-correcting-code, the slightly-compressible data can be encoded using a medium-strength error-correcting-code, and the uncompressible data can be encoded using a weak error-correcting-code.

The memory uses a flag 206 that is stored along with a storage word 202 to indicate the type of error-correcting code that was used to generate the coded word.

To illustrate the intuition behind the present invention, consider an (n, m) ECC code. Note that, an (n, m) ECC code is an ECC code that uses n-bit code words, each of which encodes m bits of data (n≧m). Moreover, note that, an (n, m) ECC code uses (n−m) bits of redundancy for protection.

For example, the Hamming (7, 4) code is a single-error correcting (1-EC) code which protects 4 bits of data with 3 extra ECC bits. Each valid 7-bit codeword differs in at least 3 bits from any other valid codeword. Thus, an arbitrary single-bit error can be corrected because the corrupted word will still be closer (in Hamming distance) to its correct value than to any other codeword.

Now, take any 8 of the 16 code-words and introduce each of the 7 possible 1 bit errors into each of them. This produces, with the original 8 code-words, a total of 64 7-bit code-words. Note that this is a (7, 6) code with no error-correcting capability (we have removed the redundancy).

However, each of these 64 code-words still has Hamming distance≧2 from the other original 8 code-words in the (7, 4) code. Thus, the 72 code-words can be viewed as a combination of a (7, 3) ECC code and a (7, 6) non-ECC code in the same 7-bit space.

Note that, in one embodiment of the present invention, these 64 code-words can be used for transmitting 6-bit data items where some common 6-bit patterns are compressed down to 3 bits. These compressible patterns get the benefit of the ECC, while the incompressible patterns do not.

Furthermore, note that full single-error correction on a 6-bit word would require at least 4 extra ECC bits, for a total of 10 bits of storage. Instead, by using the 64 code-words as described above, common data patterns can be protected using only 7 bits of storage instead of 10 bits of storage.

Likewise, a 64 bit data word can be single error protected with a 7 bit ECC using a Hamming (71, 64) code. Suppose a compression technique can compress some of the 64-bit data words down to 36 bits. Note that three copies of a 3-error-correcting (23, 12) Golay code use only 69 of the 71 bits. Hence, the 3-error-correcting (23, 12) Golay code can be applied to the 36-bit compressed word by splitting the compressed word into three 12-bit sub-words and then applying the (23, 12) Golay code to each 12-bit sub-word. As a result, for data words that can be compressed down to 36 bits, this encoding scheme corrects up to 3-bit errors. On the other hand, data words that cannot be compressed down to 36 bits are protected using the standard 7 bit ECC using a Hamming (71, 64) code, which corrects only 1-bit errors.

Note that the above described error detection and error protection technique requires a flag that indicates the type of error-correcting code that was used to generate the coded-word.

In one embodiment of the present invention, the flag is generated and stored along with the coded-word.

Furthermore, in one embodiment of the present invention, the flag is generated by concatenating multiple copies of a 1-bit indicator that indicates the type of error-correcting code used.

Specifically, in one embodiment of the present invention, if the coded-word is single-error protected with a 7 bit ECC using a Hamming (71, 64) code, the generated flag is equal to "00000". Conversely, if the coded-word is 3-bit-error protected using a (23, 12) Golay code, the generated flag is equal to "11111".

Furthermore, in one embodiment of the present invention, the flag is asymmetrically protected. For example, the flag can be asymmetrically protected as follows: 2 or more set bits in the 5-bit flag indicate that the coded-word was generated using the 3-error-correcting (23, 12) Golay code, whereas 0 or 1 set bits in the flag indicate that the coded-word was generated using the 1-error-correcting Hamming (71, 64) code. Note that, due to asymmetrical protection, the flag is 3-bit-error protected when the coded-word is generated using a 3-error-correcting (23, 12) Golay code. On the other hand, the flag is 1-bit-error protected when the coded-word is generated using a 1-error-correcting Hamming (71, 64) code.

In one embodiment of the present invention, the memory system includes (a) a memory block compression device, (b) a standard SECDED coder/decoder, and (c) an extended multiple-ECC coder/decoder.

It will be apparent to one skilled in the art that the present invention can be used to improve the reliability of any storage device that stores information in fixed-size data blocks that are susceptible to errors. For example, the present invention can be used to improve the reliability of data blocks stored in a cache or data stored on disks.

Process of Using Data Compression to Improve Reliability

Figure 3:
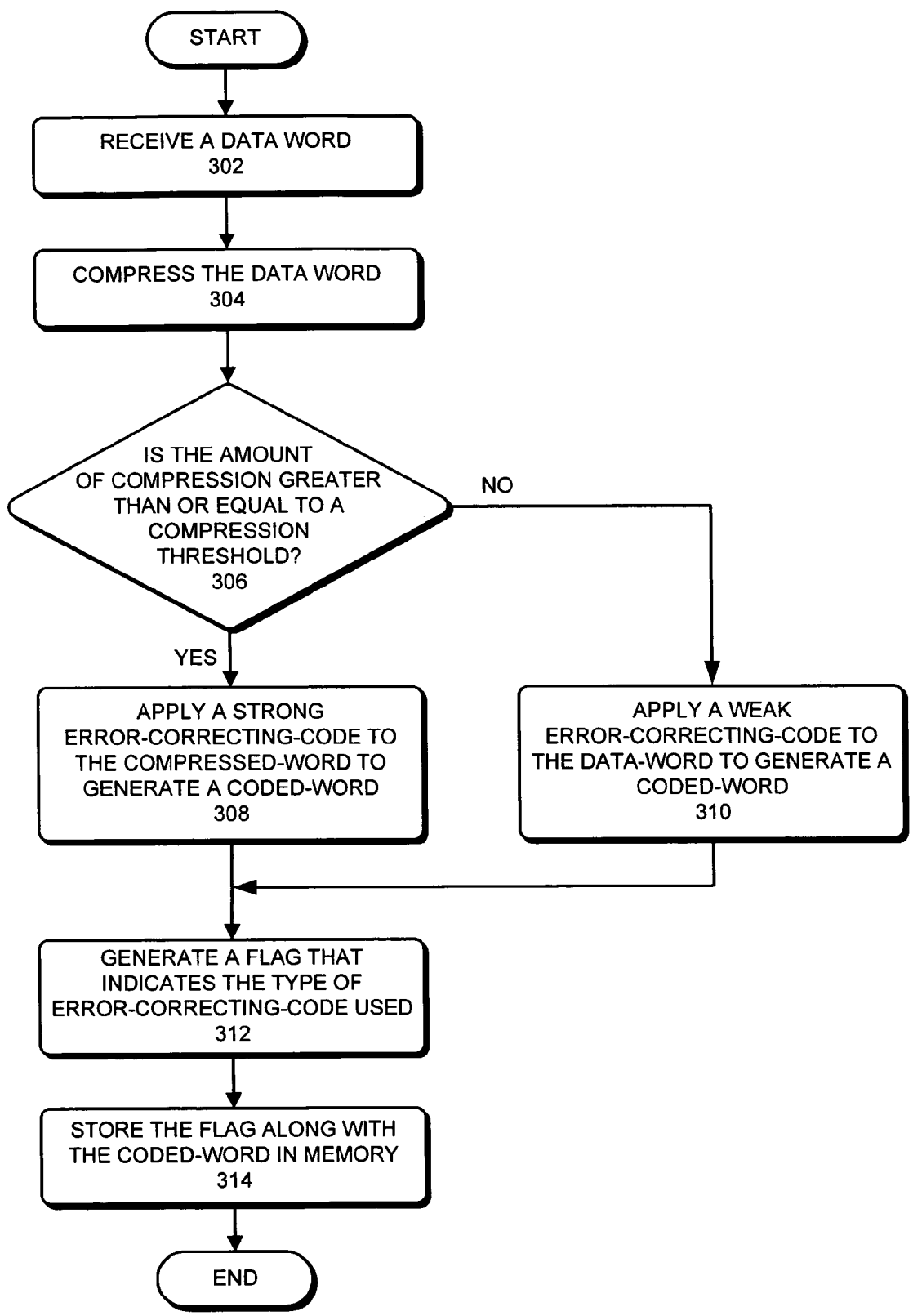
FIG. 3 presents a flowchart that illustrates the process of using data compression to improve reliability of a memory in accordance with an embodiment of the present invention.

FIG. 3 presents a flowchart that illustrates the process of using data compression to improve reliability of a memory in accordance with an embodiment of the present invention.

The process starts by receiving a data word (step 302). Next, the system compresses the data word (step 304). The system then checks whether the amount of compression is greater than or equal to a compression threshold (step 306).

If the amount of compression is greater than or equal to the compression threshold, the system applies a strong error-correcting-code to the compressed word to generate a coded-word (step 308). On the other hand, if the amount of compression is less than the compression threshold, the system applies a weak error-correcting-code to the (uncompressed) data word to generate a coded-word (step 310).

In one embodiment of the present invention, the data-word is 64 bits long, and the compression-threshold is equal to 28 bits, so that the strong error-correcting-code is used only if the size of the compressed-word is less than or equal to 36 bits.

Furthermore, in one embodiment of the present invention, the weak error-correcting-code is a SECDED (single error correction, double error detection) code. For example, a SECDED code can be constructed using a Hamming (71, 64) code, which uses 71 bits to encode 64 bits of data.

Additionally, in one embodiment of the present invention, the strong error-correcting-code is a 3-error-correcting (23, 12) Golay code, which uses 23 bits to encode 12 bits of data.

Moreover, in one embodiment of the present invention, applying the strong error-correcting-code to the compressed-word to generate the coded-word involves three steps: (a) splitting the compressed-word into a plurality of sub-words, (b) applying the strong error-correcting-code to each sub-word, and (c) concatenating the coded sub-words to form the coded-word.

The system then generates a flag that indicates the type of error-correcting code used (step 312).

In one embodiment of the present invention, the flag is generated by applying a flag error-correcting-code to an indicator, which contains one or more bits that indicate the type of error-correcting code used to generate the coded-word. Moreover, in one embodiment of the present invention, applying the flag error-correcting-code to the indicator involves concatenating multiple copies of the indicator.

Finally, the system stores the flag along with the coded-word in memory (step 314).

Figure 4:
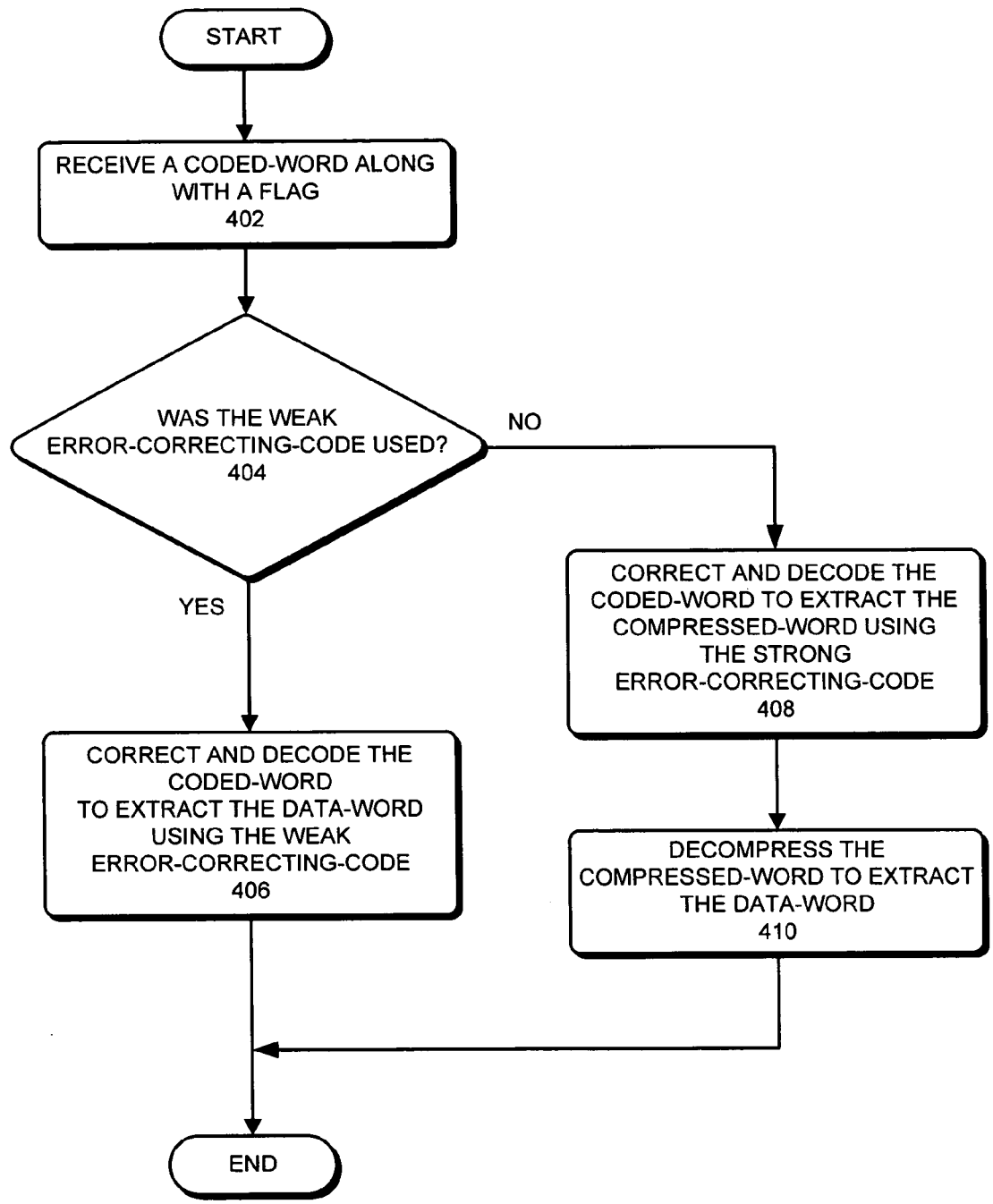
FIG. 4 presents a flowchart that illustrates the process of reading data from a memory that uses compression to improve reliability in accordance with an embodiment of the present invention.

FIG. 4 presents a flowchart that illustrates the process of reading data from a memory that uses compression to improve reliability in accordance with an embodiment of the present invention.

The process starts by receiving the coded-word along with the flag (step 402).

Next, the system checks whether the weak error-correcting-code was used (step 404). If the weak error-correcting-code was used, then the system corrects and decodes the coded-word to extract the data-word using the weak error-correcting-code (step 406).

On the other hand, if the weak error-correcting-code was not used (i.e., the strong error-correcting-code was used), the system corrects and decodes the coded-word to extract the compressed-word using the strong error-correcting-code (step 408). The system then decompresses the compressed-word to extract the data-word (step 410).

The foregoing descriptions of embodiments of the present invention have been presented for purposes of illustration and description only. They are not intended to be exhaustive or to limit the present invention to the forms disclosed.

Accordingly, many modifications and variations will be apparent to practitioners skilled in the art. Additionally, the above disclosure is not intended to limit the present invention. The scope of the present invention is defined by the appended claims.

What is claimed is:

1. A method for using data compression to improve error detecting and error correcting capabilities of a memory, wherein the memory supports error detection and error correction, and wherein the memory stores data in storage-words whose size is equal to a storage-word size, the method comprising:
   receiving a data-word stored in a storage word;
   compressing the data-word to obtain a compressed-word, whereby the data-word is compressed by an amount of compression;
   responsive to determining that the amount of compression is greater than or equal to a compression-threshold, applying a strong error-correcting-code to the compressed-word to generate a coded-word in place of the data-word in the storage word, wherein the coded-word's size is less than or equal to the storage-word size;
   generating a flag that is associated with the strong error-correcting code; and
   storing the flag along with the coded-word in the memory;
   thereby improving the overall reliability of the memory without requiring the memory to use storage-words whose size is greater than the storage-word size.

2. The method of claim 1, further comprising:
   receiving the coded-word along with the flag, which indicates the type of error-correcting code that was used to generate the coded-word; and
   responsive to determining that the strong error-correcting-code was used to generate the coded-word,
      using the strong error-correcting-code to decode the coded-word to obtain the compressed-word; and
      decompressing the compressed-word to obtain the data-word.

3. The method of claim 1, wherein the data-word is 64 bits long, the compression-threshold is equal to 28 bits, and the strong error-correcting-code is used only if the size of the compressed-word is less than or equal to 36 bits.

4. The method of claim 1, wherein the strong error-correcting-code is a 3-error-correcting (23, 12) Golay code, which uses 23 bits to encode 12 bits of data.

5. The method of claim 1, wherein applying the strong error-correcting-code to the compressed-word to generate the coded-word involves:
   splitting the compressed-word into a plurality of sub-words;
   applying the strong error-correcting-code to each sub-word; and
   concatenating the coded sub-words to form the coded-word.

6. The method of claim 1, wherein the flag is generated by applying a flag error-correcting-code to an indicator, which contains one or more bits that indicate the type of error-correcting code used to generate the coded-word.

7. The method of claim 6, wherein applying the flag error-correcting-code to the indicator involves concatenating multiple copies of the indicator.

8. A computer-readable storage medium storing instructions that when executed by a computer cause the computer to perform a method for using data compression to improve error detecting and error capabilities of a memory, wherein the memory supports error detection and error correction, and wherein the memory stores data in storage-words whose size is equal to a storage-word size, the method comprising:
   receiving a data-word stored in a storage word;
   compressing the data-word to obtain a compressed-word, whereby the data-word is compressed by an amount of compression;
   responsive to determining that the amount of compression is greater than or equal to a compression-threshold, applying a strong error-correcting-code to the compressed-word to generate a coded-word in place of the data-word in the storage word, wherein the coded-word's size is less than or equal to the storage-word size;
   generating a flag that is associated with the strong error-correcting code; and
   storing the flag along with the coded-word in the memory;
   thereby improving the overall reliability of the memory without requiring the memory to use storage-words whose size is greater than the storage-word size.

9. The computer-readable storage medium of claim 8, the method further comprising:
   receiving the coded-word along with the flag, which indicates the type of error-correcting code that was used to generate the coded-word; and
   responsive to determining that the strong error-correcting-code was used to generate the coded-word,
      using the strong error-correcting-code to decode the coded-word to obtain the compressed-word; and
      decompressing the compressed-word to obtain the data-word.

10. The computer-readable storage medium of claim 8, wherein the data-word is 64 bits long, the compression-threshold is equal to 28 bits, and the strong error-correcting-code is used only if the size of the compressed-word is less than or equal to 36 bits.

11. The computer-readable storage medium of claim 8, wherein the strong error-correcting-code is a 3-error-correcting (23, 12) Golay code, which uses 23 bits to encode 12 bits of data.

12. The computer-readable storage medium of claim 8, wherein applying the strong error-correcting-code to the compressed-word to generate the coded-word involves:
   splitting the compressed-word into a plurality of sub-words;
   applying the strong error-correcting-code to each sub-word; and
   concatenating the coded sub-words to form the coded-word.

13. The computer-readable storage medium of claim 8, wherein the flag is generated by applying a flag error-correcting-code to an indicator, which contains one or more bits that indicate the type of error-correcting code used to generate the coded-word.

14. The computer-readable storage medium of claim 13, wherein applying the flag error-correcting-code to the indicator involves concatenating multiple copies of the indicator.

15. An apparatus for using data compression to improve error detecting and error correcting capabilities of a memory, wherein the memory supports error detection and error correction, and wherein the memory stores data in storage-words whose size is equal to a storage-word size, the apparatus comprising:
   a receiving mechanism configured to receive a data-word stored in a storage word;

a compressing mechanism configured to compress the data-word to obtain a compressed-word, whereby the data-word is compressed by an amount of compression;

a strong-encoding mechanism, wherein responsive to determining that the amount of compression is greater than or equal to a compression-threshold, the strong-encoding mechanism is configured to apply a strong error-correcting-code to the compressed-word to generate a coded-word in place of the data-word in the storage word, wherein the coded-word's size is less than or equal to the storage-word size;

a flag-generating mechanism configured to generate a flag that is associated with the strong error-correcting code; and a storing mechanism configured to store the flag along with the coded-word in the memory;

wherein the apparatus improves the overall reliability of the memory without requiring the memory to use storage-words whose size is greater than the storage-word size.

16. The apparatus of claim 15, further comprising:

a second receiving mechanism configured to receive the coded-word along with the flag, which indicates the type of error-correcting code that was used to generate the coded-word; and a strong-decoding mechanism, wherein responsive to determining that the strong error-correcting-code was used to generate the coded-word, the strong-decoding mechanism is configured to:

use the strong error-correcting-code to decode the coded-word to obtain the compressed-word; and decompress the compressed-word to obtain the data-word.

17. The apparatus of claim 16, wherein the data-word is 64 bits long, the compression-threshold is equal to 28 bits, and the strong error-correcting-code is used only if the size of the compressed-word is less than or equal to 36 bits.

18. The apparatus of claim 16, wherein the strong error-correcting-code is a 3-error-correcting (23, 12) Golay code, which uses 23 bits to encode 12 bits of data.

19. The apparatus of claim 16, wherein the strong-encoding mechanism is further configured to:

split the compressed-word into a plurality of sub-words;

apply the strong error-correcting-code to each sub-word; and concatenate the coded sub-words to form the coded-word.

20. The apparatus of claim 16, wherein the flag-generating mechanism is further configured to apply a flag error-correcting-code to an indicator to generate the flag, wherein the indicator contains one or more bits that indicate the type of error-correcting code used to generate the coded-word.

21. The apparatus of claim 20, wherein the flag-generating mechanism is further configured to concatenate multiple copies of the indicator, thereby applying a flag error-correcting-code to the indicator.

* * * * *